United States Patent [19]

Rostek et al.

[11] 4,109,295
[45] Aug. 22, 1978

[54] SOLDERLESS CIRCUIT BOARD COMPONENT

[75] Inventors: Paul M. Rostek, San Diego; John F. Baeyertz, Escondido, both of Calif.

[73] Assignee: NCR Corporation, Dayton, Ohio

[21] Appl. No.: 820,654

[22] Filed: Aug. 1, 1977

[51] Int. Cl.² ............................................. H05K 1/04
[52] U.S. Cl. .................................. 361/401; 361/303; 361/306
[58] Field of Search ............... 361/401, 406, 301, 302, 361/303, 306, 308, 309, 310; 339/17 C, 17 R, 95 R; 174/52 P, 52 PE; 338/317

[56] References Cited

U.S. PATENT DOCUMENTS

| | | | |
|---|---|---|---|
| 2,892,130 | 6/1959 | Kilby | 361/406 |
| 2,990,498 | 6/1961 | Evans | 361/401 |
| 3,061,816 | 10/1962 | Reynolds | 361/401 |
| 3,142,783 | 7/1964 | Warren | 361/401 |
| 3,219,886 | 11/1965 | Katzin | 361/401 |
| 3,505,575 | 4/1970 | Barbini | 361/310 |
| 3,524,960 | 8/1970 | Lohff | 339/17 C |
| 3,718,750 | 2/1973 | Sayers | 339/95 R |
| 3,774,142 | 11/1973 | Siegler | 339/95 R |

*Primary Examiner*—David Smith, Jr.

*Attorney, Agent, or Firm*—J. T. Cavender; Edward Dugas

[57] ABSTRACT

A circuit board component, specifically a capacitor, which is configured to be machine-insertable into apertures of a circuit board to make a solderless electrical connection to electrical conductors positioned on and in the circuit board. The component is a cylindrical element which has portions of its outer surface affixed with an electrically conductive material which material is formed with a plurality of serrations. The serrations are designed to cut through and to make a force fit, gas tight, seal with the walled portions and the electrical conductors of a circuit board. The electrically conductive material also either forms a part of the component, such as capacitor plates and/or provides a contact surface for the connecting of an internally-mounted electrical component. An indexing means positioned on one end of the cylindrical element provides a mechanical indexing to insure the correct orientation of the component with regard to corresponding electrical contacts on the circuit board. A flange member extending from one end of the cylindrical element provides a stop in order to insure proper alignment of the component when the component is inserted into a circuit board by automatic means.

5 Claims, 6 Drawing Figures

SOLDERLESS CIRCUIT BOARD COMPONENT

CROSS-REFERENCE TO RELATED APPLICATIONS

The present application is related to U.S. patent application Ser. No. 820,655 entitled "Machine Insertable Circuit Board Electronic Component" which application bears the assignee's Docket No. 2550 and which application was filed on even date herewith.

BACKGROUND OF THE INVENTION

In the manufacture of electronic circuitry of the type which utilizes circuit boards having discrete devices mounted thereon, it has been found to be highly advantageous to eliminate manual insertion techniques, for the discrete components, and to replace such techniques with automatic insertion techniques. The automatic placement of parts on the circuit board is more desirable, due to the fact that it is cheaper, quicker and substantially error free. Once the desirability of automatic insertion and fastening of discrete components to the circuit board has been decided upon, then the problems associated with the handling of the particular discrete components become acute. Some of the problems are of course the physical design of the components must be such that the fabricating machine can index the component in the correct polarity and/or angular relationship with respect to the conductors on the circuit board, and also in the physical transportation of the component from the parts bin to the circuit board under fabrication. One additional problem is associated with the soldering of the circuit board conductors to the discrete device in order to make a secure electrical contact. Various techniques have been used to achieve the soldering joint, namely, manual techniques, flow soldering, dip soldering, etc. It would be highly desirable to have a discrete electronic component which could be machine insertable into a circuit board without the need for soldering, while still maintaining a highly conductive and contaminent-free electrical contact.

A number of configurations have been proposed for machine-insertable components. In for example, U.S. Pat. No. 2,990,498, entitled "Capacitor" by S. W. Evans, there is disclosed an electronic component which is particularly adaptable to being inserted into a circuit board. More specifically, there is disclosed a capacitor which is trapezoidal in shape and which is formed by a dialectric material having electric plates on either side thereof with the capacitor being inserted edgewise into a rectangular opening in the circuit board.

The plates of the electrical component are soldered to the circuit board to provide the required electrical contact and in addition it appears that some support is provided by the soldered joint. Another patent of interest is U.S. Pat. No. 3,142,783, entitled "Electrical Circuit System" by W. B. Warren wherein there is disclosed a circuit board having a hole drilled therethrough for receiving an electrical component which component is cylindrical in shape. Each end of the cylindrical component, or housing for a component, has an electrical conductor affixed thereto for making contact with electrical conductors on the circuit board. One end of the hole in the circuit board is provided with tabs that project into the open area so as to limit the travel of the component when it is inserted into the circuit board. For the components shown in the subject patent, connection is made by means of welding or soldering the electrical board conductors to the electrical conductors on the component.

Another device of interest is disclosed in U.S. Pat. No. 3,218,584, entitled "Strip Line Connector" by D. R. Ayer. The device disclosed in the subject patent is one which can make contact to a multi-layer printed circuit board. The component is provided with layers and associated contacts which contacts engage corresponding contacts affixed to the circuit board. The board contacts are bent so as to provide a spring action which insures contact when pressure is applied during the insertion of the component.

Another prior art device particularly adaptable for use with a printed circuit board is disclosed in U.S. Pat. No. 3,417,294, entitled "Mounting Circuit Elements in Printed Circuit Boards" by M. Steidlitz. In that patent there is disclosed an electronic component which is cylindrical in shape and which has a segment of the outer cylinder wall forming at least one electrical contact along with a tab which projects from the cylinder wall through an area not covered by the electrical contact forming at least one other electrical connection. Electrical contact between the board electrical conductors and the corresponding conductors on the electrical component is accomplished by compressing the respective layers of the board to cause a compression joint between the electrical conductors.

Another device of interest is disclosed in U.S. Pat. No. 3,480,836, entitled "Component Mounted In A Printed Circuit" by J. Aronstein. In that patent there is provided a circuit board through which an apertured opening is formed having a tab index. An electronic component having an outside diameter which is less than the diameter of the hole is inserted and indexed using a projecting tab within the hole. Electrical conductors on the circuit board project into the hole and are electrically bonded to corresponding conductors on the circuit component. The particular bonding must be individually done in that the circuit board conductors shown are electrically isolated from each other.

In order to minimize the cost and to increase the effectiveness of the automatic machinery used to insert electrical components, it appears highly desirable that the circuit boards contain easily drillable apertures, namely holes, rather than rectangular and/or odd-shaped openings, particularly openings that require key indexing which in turn requires accurate punching and/or milling of the board. In addition, another desirable feature would be that of having the components adaptable for use in a multi-layer board that is, where conductors which are embedded within the board at different layers can also be easily attached to the contacts of the electrical component. Another desirable feature for any automatic mounted component is to enable the component to be inserted into the board using automatic techniques which insertion process also causes the electrical bond normally accomplished by soldering to be made simultaneously with the insertion.

SUMMARY OF THE INVENTION

The present invention is directed to an electrical component particularly adapted to being mounted in a circuit board utilizing a solderless configuration, and more particularly, to a circuit board component which is formed of a cylindrical element having at least two electrical conductive sectors on the outer surface of the cylindrical element which sectors contain a plurality of serrations that are designed to cut through the inner wall surfaces of a circuit board including the conductive material therein. A flange member extends from one end of the cylindrical element to provide a stopping action for the component when the component is inserted into the circuit board. Another physical feature of the invention is an index key which is affixed to the one end of the component for aligning the component by machine. Such an alignment capability insures the proper contact of the electrically-conductive material positioned on the sectors with corresponding electrical conductors on the circuit board.

In one preferred embodiment of the invention, the component is a capacitor wherein the cylindrical element is formed from an insulating material which insulating material forms the dielectric of the capacitor and the electrically-conductive material positioned on the outer surfaces of the cylindrical member forms the plates of the capacitor. In such an embodiment, the surface area of the plates, the type of dielectric material and the diameter of the cylinder determine the value of the capacitor.

From the foregoing it can be seen that it is a primary object of the present invention to provide an improved circuit board component.

It is another object of the present invention to provide a circuit board component which is particularly adaptable to automatic machine insertion.

It is yet another object of the present invention to provide an electrical component for a circuit board of the multi-layer type wherein electrical contacts through two or more layers of electrical conductors is facilitated without necessitating soldering.

These and other objects of the present invention will become more apparent and better understood when taken in conjunction with the following description and drawings, wherein like characters indicate like parts and which drawings form a part of the present application.

DESCRIPTION OF THE PREFERRED EMBODIMENT

Figure 1:
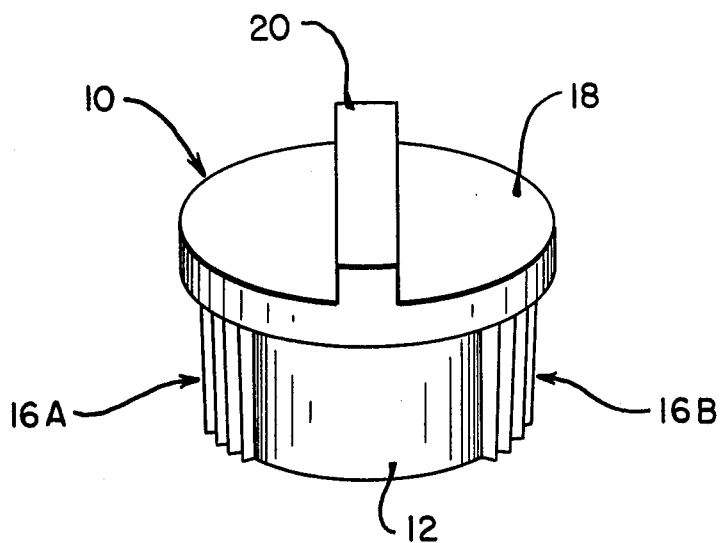
FIG. 1 is a perspective view of the preferred embodiment of the invention.
Figure 2:
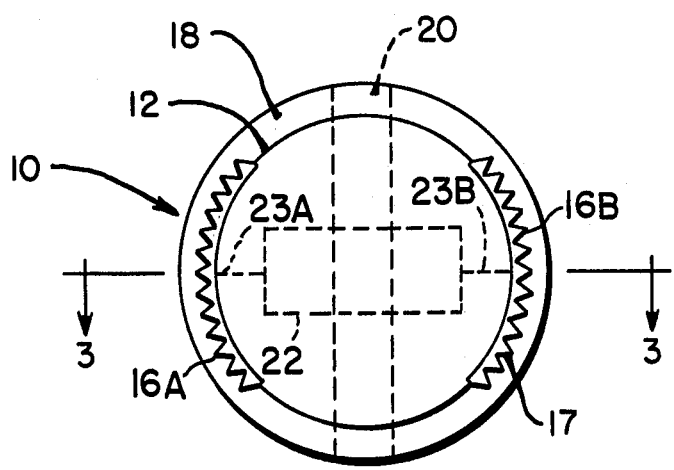
FIG. 2 is a bottom view of the preferred embodiment illustrated in FIG. 1.

Referring to FIGS. 1 and 2, the circuit board component 10 is shown comprised of a cylindrical body member 12 having two connector areas 16A and 16B which contain electrically conductive material such as a metal like, gold, aluminum, copper, or zinc, formed into a plurality of serrations 17. A flange member 18 is shown affixed to or formed as an integral part of the body member 12 and positioned at one end of the body member. Positioned atop of or formed integrally therewith is a key member 20 that projects upward from the top surface of the flange member 18.

The cylindrical body member 12 may be formed from a material such as ceramic tantalum, silicon, which material will form the dielectric portion of a capacitor. The diameter and the height of the cylinder will affect the magnitude of the capacitor when taken in conjunction with the surface area of the serrated contacts 16A and 16B. By selecting the area of the contacts along with the diameter and height of the cylinder any value of capacitance of the type normally used in circuit board electronics can be fabricated.

The cylindrical body member 12 may be hollow with an electrical component 22 inserted therein and electrically connected to plates 16A and 16B by means of leads 23A and 23B, respectively.

Figure 3:
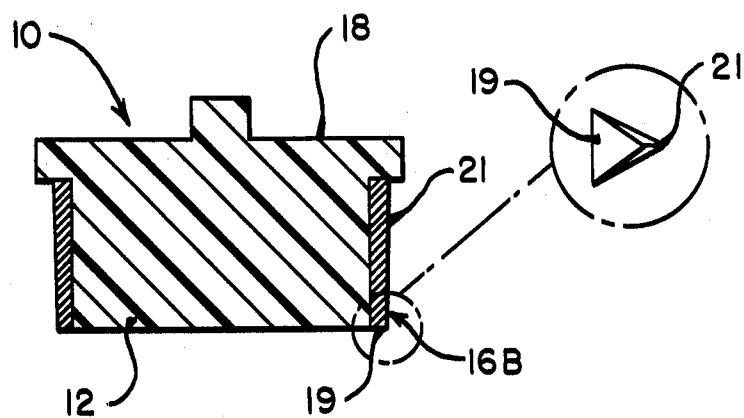
FIG. 3 is an enlarged section view of a portion of the embodiment illustrated in FIGS. 1 and 2 taken along the section lines 3—3.

Referring now to FIG. 3 wherein an enlarged view of the serration configuration is shown. In FIG. 3 the individual serration positioned on the circuit area 16 is shown comprised of an elongated triangular body having a section which tapers from the end 21 to the end 19. The taper is such as to enable the component to be slip fitted into the opening of a circuit board at the end 19 and to provide a sequentially tighter fit as the component is fully inserted into the board up to the limit of the flange member 18.

Figure 4:
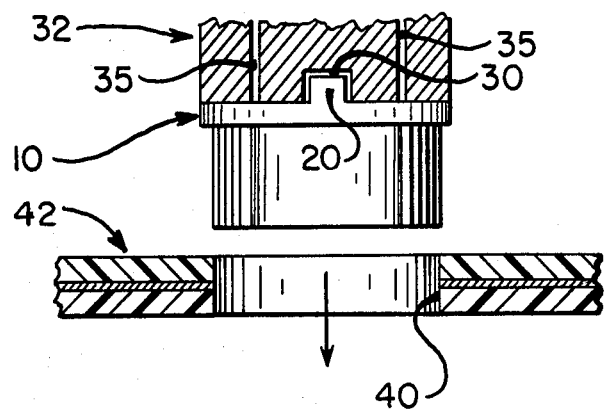
FIG. 4 is an action view, partially sectioned, illustrating the positioning of the electrical component just prior to insertion into a circuit board.

Referring now to FIG. 4, the electrical component 10 is shown held by the actuating head 32 of an inserting machine which actuating head contains a receiving portion 30 for receiving the key index 20 and which actuating head also is adapted to hold the electrical component 10 by means of a vacuum that is applied through the drilled passageways 35. The electrical component 10 is shown positioned in axial alignment with an apertured opening 40 passing through a circuit board 42. The inserting machine following the action arrow will press fit the electrical component 10 into the opening 40 in the circuit board 42.

Figure 5:
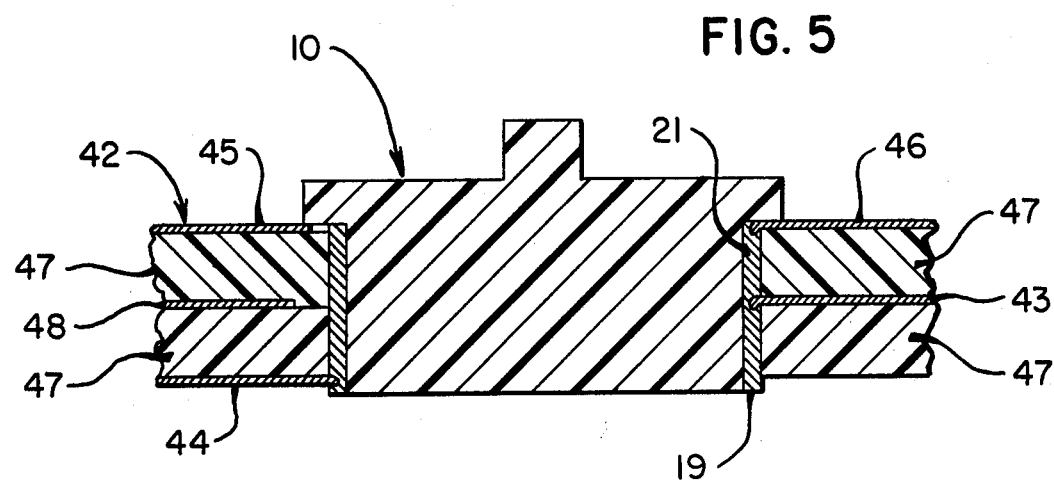
FIG. 5 is a sectioned view illustrating the postioning of the electronic component mounted within the circuit board.

Referring now to FIG. 5 wherein the electrical component 10 is shown fully inserted within the circuit board 42. The circuit board 42 is shown comprised of a number of conductors 45, 44, 46, 43 and 48. Each of the conductors is separated in part by insulating layers 47. Those conductors which are not to make contact with the electrical component 10 have been etched away in the fabrication process back from the opening 40. Specifically, conductors 45 and 48 have been etched back away from the contact surfaces of the electronic component 10. The remaining conductors are cut and pressed by the serrated contacts 17. Also cut and pressed are the insulating layers 47. The lower portion of the electronic component 10 has the serrations slightly smaller in depth at the area 19 than at the area designated 21. This slight taper insures a constant compression fit across each of the entire contact area.

Figure 6:
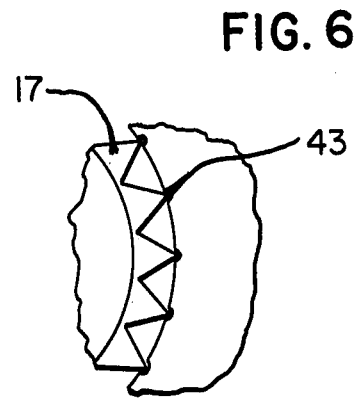
FIG. 6 is an enlarged sectional view of a portion of the component and circuit board showing its mounting interface with the circuit board.

In FIG. 6 the serrated contacts 17 are shown cutting through and pressure fitting against the conductor 43. The cutting and pressing back of the conductor layer causes a gas-tight seal to exist between the serrated contacts and the conductor material so as to provide a solderless electrical connection. The solderless connection is highly resistant to corrosion and deterioration.

Although an electrical component of the type which has only two electrical contacts is shown for purposes of disclosing the invention, it will be obvious to persons skilled in the art that the index key arrangement of the present invention will allow any number of contact areas to be positioned around the cylindrical body and multiple contacts made to the contact areas generally designated as 16A and 16B in the present disclosure.

In addition the body member 12 may be hollow and an electronic component positioned inside the body member with the leads from the electronic component extending from the component through the walls of the body member to the appropriate contact areas.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. A circuit board component comprising:
    a cylindrical body element;
    an electrical component mounted within said cylindrical body element;
    electrically conductive material positioned on portions of the outer surfaces of said body element;
    leads connecting said electrical component to said electrical conductive material through said cylindrical body element; and
    serrations in the electrically conductive material for engaging a contact area on a circuit board.

2. The circuit board component according to claim 1 and further comprising:
    a flange member extending from one end of said cylindrical body element to provide a stop for said component when said component is inserted into a hole in a circuit board.

3. The circuit board component according to claim 1 and further comprising:
    an index key affixed to one end of said cylindrical body element for aligning said conductive material with corresponding electrical conductors on a circuit board.

4. A circuit board component comprising:
    a cylindrical body element, said cylindrical body element formed from a dielectric material so as to provide the dielectric for a capacitor;
    electrically conductive material positioned on portions of the outer surface of said cylindrical body element, said electrically conductive material forming the plates of a capacitor, said conductive material having serrations therein for providing a forced contact fit of said component within a circular opening in a circuit board;
    a flange extending from one end of said cylindrical body element to provide a stop for said component when said component is inserted into a hole in a circuit board; and
    an index key affixed to one end of said component for aligning said electrically conductive material with associated electrical conductors on a circuit board.

5. A circuit board component comprising:
    a cylindrical body element, wherein said body element is formed from an insulating material so as to provide the dielectric for a capacitor;
    electrically conductive material positioned on at least two separated apart portions of the outer surface of said body element, said conductive material forming the plates of said capacitor, and formed with serrations which run along the length of said cylindrical body element;
    a flange extending from one end of said cylindrical body element for providing a stop for said component when said component is inserted into a circuit board; and
    an index key affixed to one end of said cylindrical body element for aligning said electrically conductive material with corresponding electrical conductors on a circuit board.

* * * * *